United States Patent
Chebi et al.

(10) Patent No.: US 7,605,063 B2
(45) Date of Patent: Oct. 20, 2009

(54) PHOTORESIST STRIPPING CHAMBER AND METHODS OF ETCHING PHOTORESIST ON SUBSTRATES

(75) Inventors: Robert P. Chebi, San Carlos, CA (US); Jaroslaw W. Winniczek, Daly City, CA (US); Alan J. Miller, Moraga, CA (US); Gladys S. Lo, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 522 days.

(21) Appl. No.: 11/431,104

(22) Filed: May 10, 2006

(65) Prior Publication Data
US 2007/0264841 A1  Nov. 15, 2007

(51) Int. Cl.
*H01L 21/26* (2006.01)
*B44C 1/22* (2006.01)
*C03C 15/00* (2006.01)

(52) U.S. Cl. .................. 438/513; 438/795; 216/62; 156/345.41

(58) Field of Classification Search ................ 438/513, 438/529, 535, 565, 795; 257/E21.214, E21.218, 257/E21.235; 156/345.41; 216/37, 62, 65
See application file for complete search history.

(56) References Cited

U.S. PATENT DOCUMENTS

| | | | |
|---|---|---|---|
| 4,735,762 A | 4/1988 | Lasche | |
| 5,057,184 A | 10/1991 | Gupta et al. | |
| 5,145,764 A | 9/1992 | Bauer et al. | |
| 5,338,399 A | 8/1994 | Yanagida | |
| 5,366,590 A | 11/1994 | Kadomura | |
| 5,369,072 A | 11/1994 | Benjamin et al. | |
| 5,786,276 A | 7/1998 | Brooks et al. | |
| 5,821,036 A | 10/1998 | Ficner et al. | |
| 5,824,604 A | 10/1998 | Bar-Gadda | |
| 5,872,601 A | 2/1999 | Seitz | |
| 5,911,882 A | 6/1999 | Benjamin et al. | |
| 5,965,034 A | 10/1999 | Vinogradov et al. | |
| 5,968,374 A | 10/1999 | Bullock | |

(Continued)

FOREIGN PATENT DOCUMENTS

EP  0 450 313  10/1991

(Continued)

OTHER PUBLICATIONS

International Search Report and Written Opinion dated Aug. 12, 2008 for PCT/US07/10115.

*Primary Examiner*—W. David Coleman
(74) *Attorney, Agent, or Firm*—Buchanan Ingersoll & Rooney PC

(57) ABSTRACT

Methods of processing a substrate so as to protect an active area include positioning a substrate in an inductively coupled plasma processing chamber, supplying process gas to the chamber, generating plasma from the process gas and processing the substrate so as to protect the active area by maintaining a plasma potential of about 5 to 15 volts at the substrate surface and/or passivating the active area by using a silane-free process gas including at least one additive effective to form a protective layer on the active area of the substrate wherein the protective layer includes at least one element from the additive which is already present in the active area.

20 Claims, 15 Drawing Sheets

U.S. PATENT DOCUMENTS

| | | | |
|---|---|---|---|
| 6,017,221 | A | 1/2000 | Flamm |
| 6,024,887 | A | 2/2000 | Kuo et al. |
| 6,051,504 | A | 4/2000 | Armacost et al. |
| 6,127,275 | A | 10/2000 | Flamm |
| 6,174,451 | B1 | 1/2001 | Hung et al. |
| 6,207,583 | B1 | 3/2001 | Dunne et al. |
| 6,218,640 | B1 | 4/2001 | Selitser |
| 6,362,109 | B1 | 3/2002 | Kim et al. |
| 6,362,110 | B1 | 3/2002 | Marks |
| 6,379,576 | B2 | 4/2002 | Luo et al. |
| 6,380,096 | B2 | 4/2002 | Hung et al. |
| 6,391,146 | B1 | 5/2002 | Bhatnagar et al. |
| 6,406,594 | B1 | 6/2002 | Palmer et al. |
| 6,440,864 | B1 | 8/2002 | Kropewnicki et al. |
| 6,451,703 | B1 | 9/2002 | Liu et al. |
| 6,461,801 | B1 | 10/2002 | Wang |
| 6,494,991 | B1 | 12/2002 | Palmer et al. |
| 6,524,936 | B2 | 2/2003 | Hallock et al. |
| 6,652,709 | B1 * | 11/2003 | Suzuki et al. ......... 156/345.41 |
| 6,656,540 | B2 * | 12/2003 | Sakamoto et al. .......... 427/564 |
| 6,686,558 | B2 | 2/2004 | Selitser |
| 6,692,649 | B2 | 2/2004 | Collison et al. |
| 6,693,043 | B1 | 2/2004 | Li et al. |
| 6,761,796 | B2 | 7/2004 | Srivastava et al. |
| 6,767,698 | B2 | 7/2004 | Johnson |
| 6,777,173 | B2 | 8/2004 | Chen et al. |
| 6,805,139 | B1 | 10/2004 | Savas et al. |
| 6,806,038 | B2 | 10/2004 | Gu et al. |
| 6,858,112 | B2 | 2/2005 | Flamm et al. |
| 6,900,138 | B1 | 5/2005 | Yin et al. |
| 2001/0008229 | A1 | 7/2001 | Selitser |
| 2002/0005392 | A1 | 1/2002 | Luo et al. |
| 2002/0111036 | A1 | 8/2002 | Zhu |
| 2002/0144785 | A1 | 10/2002 | Srivastava et al. |
| 2002/0151156 | A1 | 10/2002 | Hallock et al. |
| 2002/0197870 | A1 | 12/2002 | Johnson |
| 2003/0015294 | A1 | 1/2003 | Wang |
| 2003/0029833 | A1 | 2/2003 | Johnson |
| 2003/0168427 | A1 | 9/2003 | Flamm et al. |
| 2004/0005517 | A1 | 1/2004 | Gu et al. |
| 2004/0043337 | A1 | 3/2004 | Chen et al. |
| 2004/0084150 | A1 | 5/2004 | George et al. |
| 2004/0140053 | A1 | 7/2004 | Srivastava et al. |
| 2004/0157170 | A1 | 8/2004 | Waldfried et al. |
| 2004/0195208 | A1 | 10/2004 | Pavel et al. |
| 2004/0214448 | A1 | 10/2004 | Chan et al. |
| 2004/0256357 | A1 | 12/2004 | Edelberg et al. |
| 2005/0022839 | A1 | 2/2005 | Savas et al. |
| 2005/0079717 | A1 | 4/2005 | Savas et al. |
| 2005/0112883 | A1 | 5/2005 | Savas et al. |
| 2005/0208733 | A1 | 9/2005 | Yin et al. |
| 2005/0211671 | A1 | 9/2005 | Yin et al. |
| 2006/0051965 | A1 | 3/2006 | Edelberg et al. |
| 2006/0169669 | A1 * | 8/2006 | Zojaji et al. .................... 216/58 |
| 2006/0177583 | A1 | 8/2006 | Sakamoto et al. |

FOREIGN PATENT DOCUMENTS

| | | |
|---|---|---|
| EP | 0 865 716 | 9/1998 |
| WO | WO 97/21330 | 6/1997 |
| WO | WO 97/21332 | 6/1997 |
| WO | WO 99/04092 | 1/1999 |
| WO | WO 99/26277 | 5/1999 |
| WO | WO 00/74117 | 12/2000 |
| WO | WO 01/29879 | 4/2001 |
| WO | WO 01/70517 | 9/2001 |
| WO | WO 01/72094 | 9/2001 |
| WO | WO 02/052349 | 7/2002 |
| WO | WO 03/007326 | 1/2003 |
| WO | WO 2004/027826 | 4/2004 |
| WO | WO 2004/111727 | 12/2004 |
| WO | WO 2005/038873 | 4/2005 |

* cited by examiner

SEM demonstrating *bad* residue result with 30 CHF$_3$/ 350 O$_2$ @ 100" followed by DI water rinse SEM demonstrating *bad* residue results with 30 CF$_4$/ 350 O$_2$ @ 100" followed by DI water rinse SEM demonstrating *residue free* results with 30 CF$_4$/ 350 O$_2$ @ 10" followed 10 CH$_3$F/ 350 O$_2$ @ 100" followed by DI water rinse. *Protective Layer (earlier results)*

SEM demonstrating residue free results with 10 SiF$_4$/ 350 O$_2$ @ 2" followed 10 CH$_3$F/ 350 O$_2$ @ 90 sec followed by DI water rinse. *Protective layer (updated results)* ized U.S. Pat. Nos. 5,968,374, 6,362,110 and 6,692,649, the disclosures of which are hereby incorporated by reference, disclose plasma photoresist stripping techniques.

PHOTORESIST STRIPPING CHAMBER AND METHODS OF ETCHING PHOTORESIST ON SUBSTRATES

BACKGROUND

Plasma processing apparatuses are used for processes including plasma etching, physical vapor deposition, chemical vapor deposition (CVD), ion implantation, and resist removal.

Photoresist materials are used in plasma processing operations to pattern materials. Commercial photoresists are blends of polymeric and other organic and inorganic materials. A photoresist is applied onto a substrate, and radiation is passed through a patterned mask to transfer the pattern into the resist layer. The two broad classifications of photoresist are negative-working resist and positive-working resist, which produce negative and positive images, respectively. After being developed, a pattern exists in the photoresist. The patterned photoresist can be used to define features in substrates by etching, as well as to deposit materials onto, or implant materials into, substrates. Commonly-assigned U.S. Pat. Nos. 5,968,374, 6,362,110 and 6,692,649, the disclosures of which are hereby incorporated by reference, disclose plasma photoresist stripping techniques.

SUMMARY

A method of protecting an active area on a substrate, comprises positioning a substrate in an inductively coupled plasma processing chamber of a plasma reactor, the plasma reactor including a dielectric window overlying the substrate and at least one coil which inductively couples RF energy through the dielectric window and into a space between the dielectric window and the substrate, the substrate including an active area, supplying a process gas to the plasma processing chamber, generating a plasma from the process gas by supplying power to the coil, processing the substrate with the plasma so as to protect the active area by (a) maintaining a plasma potential of 5 to 15 volts at the substrate and/or (b) passivating the active area by using a silane-free process gas comprising at least one additive effective to form a protective layer on an active area of the substrate wherein the protective layer includes at least one element from the additive which is already present in the active area and stripping the organic photoresist in a second step.

DETAILED DESCRIPTION

Figure 1A:
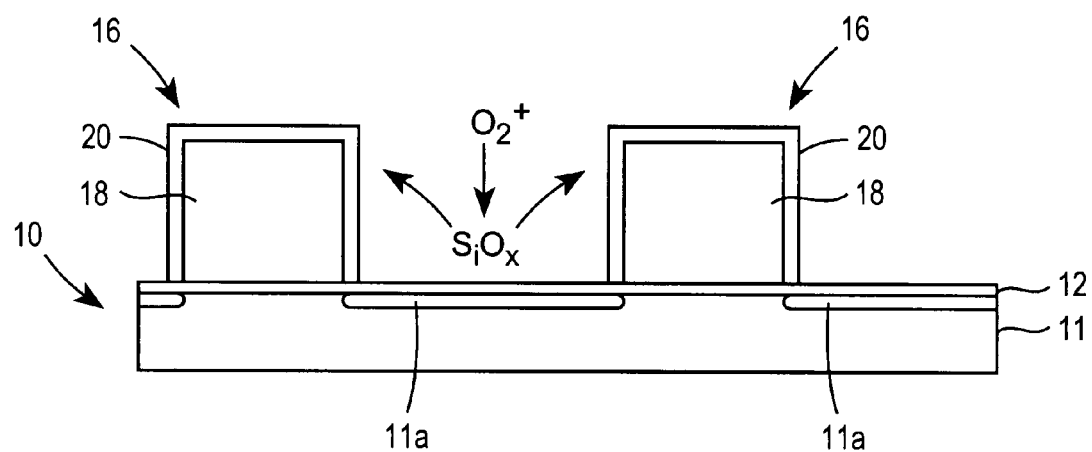
FIG. 1A illustrates a process of removing an ion-implanted photoresist over an active area (AA) on a semiconductor wafer and FIG. 1B illustrates an inductively coupled plasma chamber which can be used to carry out the photoresist stripping process illustrated in FIG. 1A.

In integrated circuit (IC) manufacturing processes that utilize ion implantation, shrinking device geometries, increased ion implantation energies and doses, and new materials make it increasingly difficult to produce residue-free devices. Residues remaining from etching and ashing processes can produce undesirable electrical effects and corrosion that reduce product yields. See E. Pavel, "Combining Microwave Downstream and RF Plasma Technology for Etch and Clean Applications," 196th Meeting of the Electrochemical Society, (October, 1999).

In plasma processing techniques, such as plasma etching and reactive ion etching (RIE), and in ion implantation, photoresist is applied onto a substrate to protect selected regions of the substrate from being exposed to ions and free radicals. Organic polymer compositions have been formulated for such resist applications.

Photoresists are removed, or "stripped," from the underlying substrate after the substrate has been processed by etching, ion implantation, or the like. It is desirable that the photoresist stripping process leave the substrate surface as clean as possible, desirably without any residual polymer film or resist material. Wet and dry stripping techniques can be used to remove photoresist. Wet stripping techniques use solutions containing organic solvents or acids. Dry stripping (or "ashing") techniques use an oxygen plasma for photoresist removal.

Ion implantation fabrication techniques are used to dope regions of a substrate with impurities to change the electrical properties of the substrate. Ion implantation can be used as a source of doping atoms, or to introduce regions of different composition in a substrate. During ion implantation, ions are accelerated at a sufficiently high voltage to penetrate the substrate surface to a desired depth. Increasing the accelerating voltage increases the depth of the concentration peak of the impurities.

Regions of the substrate at which implantation is not desired are protected with photoresist. However, the photoresist is modified during implantation, and is rendered more difficult to remove after implantation than a normal (non-implanted) photoresist. Particularly, implanted ions damage regions of the photoresist, thereby breaking near-surface C—H bonds and forming carbon-carbon single and double bonds. The resulting tough, carbon-rich or "carbonized" layer (or "skin" or "crust") of cross-linked, implanted photoresist encapsulates the distinct underlying bulk photoresist. The thickness of the carbon-rich layer is a function of the implant species, voltage, dose and current. The carbon-rich layer typically has a thickness of from about 200 Å to about 2000 Å. See, A. Kirkpatrick et al., "Eliminating heavily implanted resist in sub-0.25-μm devices," *MICRO*, 71 (July/August 1998). According to E. Pavel, as implant doses and energies increase, implanted photoresist can become increasingly more difficult to remove.

Carbon-rich layers can also be formed in organic photoresist during plasma processing techniques, other than ion-implantation techniques, in which ion bombardment of the photoresist also occurs.

Oxygen plasma ashing techniques can remove the carbon-rich layer, but only at a slow rate of about 500 Å/min or less. The etching mechanism of these techniques is the reaction of oxygen radicals with hydrocarbons in the photoresist to produce $H_2O$ and $CO_2$.

It has been determined that an RF bias can be applied to the substrate to enhance the removal rate of the cross-linked layer. The applied RF bias provides energy to the carbon-rich layer, which breaks carbon single bonds and thereby enhances reactions with oxygen radicals.

However, it has also been determined that applying an RF bias to the substrate to enhance photoresist removal can also produce undesired effects. FIG. 1A schematically depicts a process of removing organic photoresist from an ion-implanted substrate 10. The substrate 10 includes silicon 11 that is ion implanted to form active areas 11a and a thin overlying inorganic layer 12 (e.g., a silicon-containing layer, such as $SiO_x$). The inorganic layer 12 may be a silicon oxide layer that is formed by CVD or ion immersion, thermally grown, or may be a native oxide, and typically has a thickness of less than or equal to 20 Å or a thickness of 20 to 40 Å. A photoresist 16 applied over the inorganic layer 12 includes bulk photoresist 18, and an overlying carbon-rich layer 20 formed by the ion-implantation process. The features (contacts, vias, trenches, etc.) defined by the photoresist 16 are typically about 0.25 μm or less in width on the substrate 10. In an RF biased system, energetic $O_2^+$ ions can cause sputtering of the inorganic layer 12. Sputtering of the inorganic layer 12 is undesirable because for typical process specifications the maximum amount of inorganic material (e.g., oxide) loss during the removal of the carbon-rich layer 20 and the bulk photoresist 18 is less than about 2 Å. The carbon-rich layer 20 can typically have a thickness of from about 200 to about 2000 Å, and the bulk photoresist 18 can typically have a thickness of about several thousand angstroms. In addition, sputtered inorganic material can re-deposit on the substrate and on the photoresist, resulting in organic and inorganic residue being present on the substrate after cleaning.

Another undesirable effect of applying a bias voltage to the substrate during processing such as photoresist removal is that oxygen ions of the plasma may have sufficiently high energy to penetrate the thin inorganic layer and oxidize the underlying silicon within the active area. The active area includes implanted silicon, strained silicon and/or a gate oxide on a semiconductor substrate of silicon, gallium arsenide or the like.

In light of the above-described findings, it has been determined that undesired silicon loss and/or growth of a silicon oxide layer can be achieved by processing the substrate while maintaining a plasma potential at the substrate surface of about 5 to 15 volts and/or passivating the active area using a silane-free process gas comprising at least one additive to form a protective layer on the active area optionally followed by crust and photoresist removal. During the first step, it is desirable to protect the active area from silicon loss due to impingement with oxygen ions and/or minimize growth of the gate oxide due to buildup of $SiO_xF_yC_z$ where x can be 0 to 2, y can be 0 to 2 and z can be 0 to 1. Accordingly, in the first step, the silicon loss can be minimized by forming a protective layer on the active area and/or plasma potential at the substrate (wafer) can be reduced to a desired value (e.g., below 20 volts, preferably 5 to 15 volts) by various chamber design and/or process modifications. For example, the outermost periphery of the one or more induction coils overlying the dielectric window can be spaced inwardly of the chamber wall surrounding the substrate support (e.g., provide a spacing of at least 5 cm between outer turn of the coil and inner wall of chamber), the dielectric window can have an increased thickness (e.g., provide a window at least 4 cm thick), the distance between the substrate and the coil can be increased (e.g., lower the substrate support and/or add a spacer between the dielectric window and the top of the chamber to move the coil further from the substrate) such that the inductively coupled plasma chamber can be operated without use of a Faraday Shield. Another way to reduce plasma potential is by pulsing RF power applied to the induction coil during the first step, increasing impedance of ground path seen by the substrate and/or including high atomic number neutral gas species in the process gas (e.g., Ne, Kr, Xe). Passivation can be achieved by including an additive which forms a protective layer over the active area wherein the protective layer includes at least one element already present in the active area (e.g., Si, Ge, As, Sb, In, P or B through addition of a silane-free gas such as $SiF_4$, $GeF_4$, $GeH_4$, $AsH_3$, $PH_3$, $B_2$, $H_6$). If desired, other gases such as $N_2O$, $NH_3$, $CF_4$, CO, or the like can be added in the first step.

In step 2, during which the crust and/or bulk photoresist is stripped, the process gases may include various constituents including an oxygen-containing gas, one or more hydrocarbon, fluorocarbon and fluorohydrocarbon gases, and the additive used in the first step. The inorganic material can be, for example, a silicon-containing material (e.g., Si, $SiO_x$ [e.g. $SiO_2$], $Si_xN_y$ [e.g., $Si_3N_4$], $Si_xO_yN_z$, high-k metal oxide gates (e.g., $HfSi_xO_y$) and the like). The photoresist can be present on various semiconductor substrate materials such as wafers including, e.g., silicon, $SiO_2$, $Si_3N_4$, and the like.

The plasma is preferably generated from the process gas by applying radio frequency (RF) to one or more electrically conductive coils outside of the plasma processing chamber. The substrate is preferably a wafer placed in the vicinity of the plasma generation region. In a preferred embodiment, the coil is a planar coil and the exposed surface of the wafer faces and is parallel to the plane of the coil.

Figure 1B:
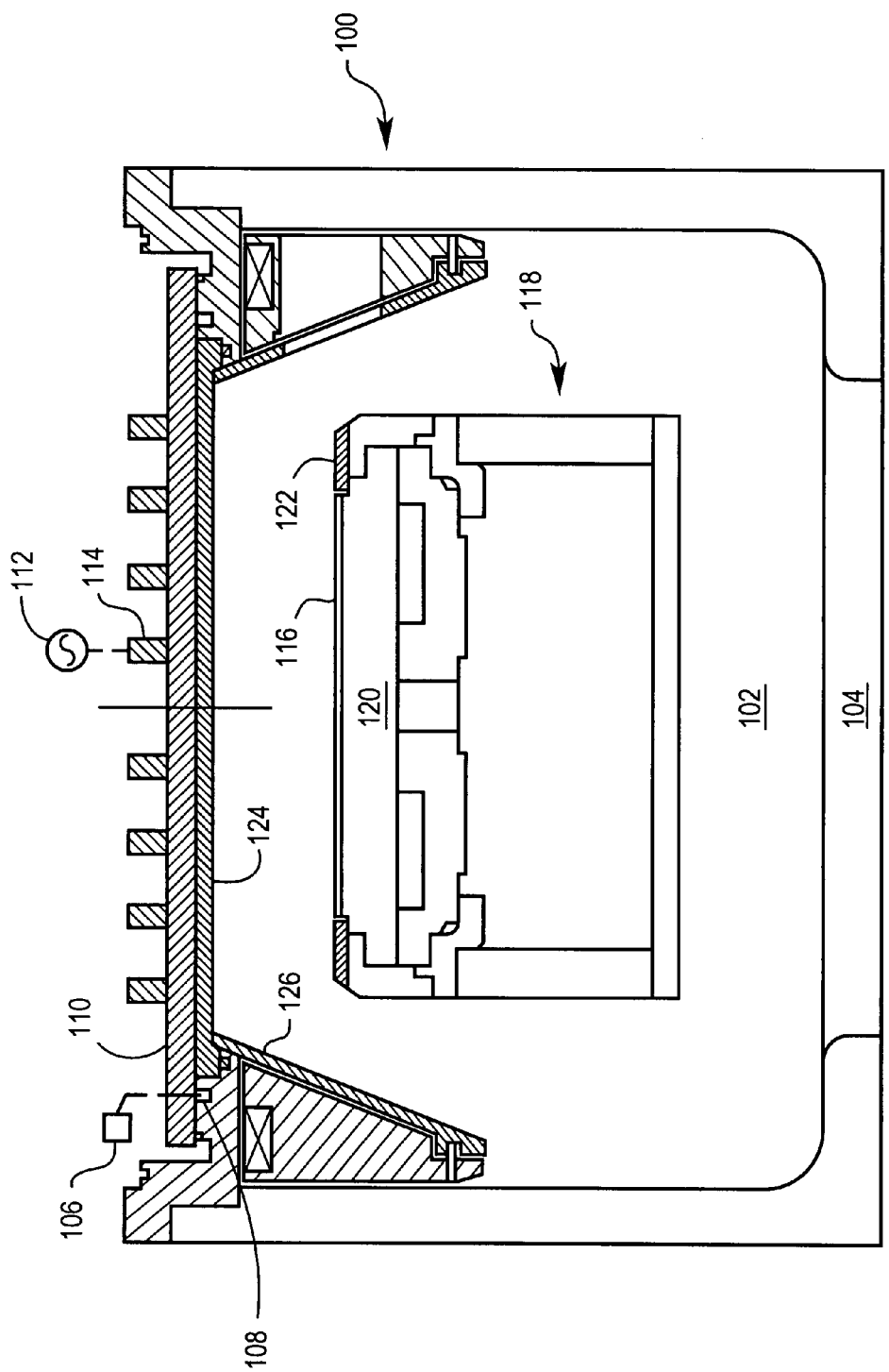

The plasma reactor is preferably an inductively coupled plasma reactor, more preferably a high density TCP™ reactor available from Lam Research Corporation, the assignee of the present application. Embodiments of the methods of removing photoresist from substrates, such as 300 mm and 200 mm substrates, can be performed in an inductively-coupled plasma reactor, such as the reactor 100 shown in FIG. 1B. The reactor 100 includes an interior 102 maintained at a desired vacuum pressure by a vacuum pump connected to an outlet 104. Process gas can be supplied to a showerhead arrangement by supplying gas from a gas supply 106 to a plenum 108 extending around the underside of a dielectric window 110. A high density plasma can be generated in the interior 102 by supplying RF energy from an RF source 112 to an external RF antenna 114, such as a planar spiral coil having one or more turns disposed outside the dielectric window 110 on top of the reactor 100.

A substrate 116, such as a semiconductor wafer, is supported within the interior 102 of the reactor 100 on a substrate support 118. The substrate support 118 can include a chucking apparatus, such as an electrostatic chuck 120, and the substrate 116 can be surrounded by a dielectric focus ring 122. The chuck 120 can include an RF biasing electrode for applying an RF bias to the substrate during plasma processing of the substrate 116. The process gas supplied by the gas supply 106 can flow through channels between the dielectric window 110 and an underlying gas distribution plate 124 and enter the interior 102 through gas outlets in the plate 124. Alternatively, the gas can be supplied by one or more gas injectors extending through the window. See, for example, commonly-assigned U.S. Pat. No. 6,230,651. The reactor can also include a liner 126 extending from the plate 124.

An exemplary plasma reactor that can be used for generating plasma is the 2300 TCP™ reactor available from Lam Research Corporation. Typical operation conditions for the plasma reactor are as follows: from about 400 to about 10,000 watts inductive power applied to upper electrode (coil), reaction chamber pressure of from about 10 to about 500 mTorr, and a total process gas flow rate of from about 200 to about 600 sccm during the passivation and photoresist removal steps.

During the passivation and photoresist removal steps, the substrate is preferably maintained at a sufficiently low temperature on a substrate support (e.g., ESC) to prevent rupturing of the carbon-rich layer. For example, a carbon-rich layer may rupture when solvents in the photoresist composition are volatilized by heating, producing particles that may deposit on the substrate. To avoid such rupturing of the carbon-rich layer, the substrate support is preferably maintained at a temperature of less than about 150° C., and more preferably from about −20 to about 75° C., and a chamber pressure of less than about 200 mTorr during passivation and removal of the photoresist.

During the passivation and photoresist removal steps, an RF bias is preferably not applied to the substrate with the bottom electrode on which the substrate is supported. Instead, the impedance path to ground seen by the substrate is preferably increased to reduce plasma potential seen at the substrate surface. Alternatively, an RF bias can be applied during the photoresist removal step during which the RF bias can accelerate ions in the plasma and add energy to the substrate, which increases the removal rate of the photoresist. The RF bias voltage applied to the substrate is preferably less than about 100 volts (with respect to ground), more preferably less than about 20 volts.

Although the chamber can be designed to provide reduced plasma potential at the substrate surface, adjustments to the plasma potential can be made by various techniques. For instance, power to the coil and/or pressure in the chamber can be adjusted to achieve a desired plasma potential. Also, gases such as Xe and Kr can be added to the process gas to lower the plasma potential and gases such as He can be added to the process gas to raise the plasma potential during the passivation and/or photoresist removal steps.

The second step can be tailored to remove the entire photoresist or the second step can include a crust break through stage followed by a photoresist strip stage. If desired, the complete removal of the carbon-rich layer can be detected during the etching process by using an endpoint detection technique, which can determine the time at which the underlying bulk photoresist is exposed. For example, the endpoint for carbon-rich layer removal can be determined by an optical emission technique (e.g., the optical emission technique can monitor the emission from carbon monoxide (CO) at a wavelength such as about 520 nm.) During the removal of the carbon-rich layer, a small CO signal is produced due to the low etch rate. Once the carbon-rich layer is opened, the exposed underlying bulk photoresist is etched at a faster rate than the carbon-rich layer and, consequently, the CO concentration and the corresponding CO signal increase.

After removal of the carbon-rich layer, the underlying bulk photoresist can be removed using a different photoresist etch process. For example, the bulk photoresist can be removed by oxygen ashing at a higher temperature than the temperature preferably used during the carbon-rich layer etching step. For example, the substrate temperature can range from about 150° C. to about 300° C., preferably 200 to 280° C., during the bulk photoresist etching step. The chamber pressure is preferably greater than about 500 mTorr during bulk photoresist removal. Oxygen ashing also can achieve a high removal rate of the bulk photoresist. For example, an $O_2/N_2$ plasma can remove the bulk photoresist at a rate of from about 4 to about 6 microns/min. An optional over-ash step can also be used. Volatile solvents in the photoresist can be exhausted from the plasma processing chamber as the photoresist is ashed.

The bulk photoresist is preferably removed in the same chamber or a different chamber using a plasma generated upstream from the substrate. However, the bulk photoresist removal step can be performed in the same processing chamber that is used for the passivation and crust removal steps. Alternatively, the bulk photoresist can be removed in a different processing chamber. That is, the substrate can be removed from the processing chamber after the passivation and crust removal steps, and placed in a different processing chamber to etch the bulk photoresist. Using different processing chambers can obviate changing gas chemistries and/or the substrate temperature during removal of the carbon-rich layer and ashing, respectively.

Exemplary process conditions for passivation and/or photoresist removal on a 300 mm wafer are as follows: chamber pressure of about 10-500 mTorr, preferably 50 to 90 mTorr, power applied to upper electrode (coil) of about 400-10,000 Watts, preferably 400 to 3500 Watts of pulsed time averaged power during the passivation step, power applied to bias electrode of about 0-10 Watts, preferably 0 Watts during the passivation step, gas flow rates of about 1 to 20 sccm for the additive-containing gas (e.g., 1 to 20 sccm $SiF_4$), about 200 to 500 sccm for the oxygen-containing gas, 10 to 50 sccm fluorocarbon and/or fluorohydrocarbon gas (e.g., $CF_4$), 100 to 800 sccm inert or high atomic number gas (e.g., Ar, Ne, Kr, Xe) and substrate support temperature of below 75° C., preferably from −20° C. to about 20° C.

If the entire photoresist is not removed in the second step, it is desirable that any residue is soluble in deionized water, thereby minimizing the need for wet stripping techniques. Process parameters such as the flow rates of the process gases and their pressures may be adjusted to achieve selective etching of the carbon-rich layer relative to the inorganic layer and the bulk photoresist can be removed using the same or different process gas.

In the case where the entire photoresist is not removed during the second step, exemplary process conditions for removing the remaining bulk photoresist in a downstream plasma strip chamber are as follows: chamber pressure of about 1000 mTorr, about 2500 Watts of power applied to the plasma source, total process gas flow rate of about 4400 sccm, and substrate temperature of about 220° C.

As device geometries shrink to 65 nm and below, certain difficulties with material loss are encountered in front end of line (FEOL) processing, such as in etch and post implant strip and clean. The active areas of substrates are subjected to various levels of implants, followed by strip and post strip cleans. The dry or wet effects on active area can be detrimental from a material or dopant loss prospective. Material loss can occur as the active area is subjected to repetitive strip and cleans or etch processes. As material loss increases various device characteristics change, including drive current, leakage, resistivity and short channel effects. Device sensitivity to material loss increases even further as device geometries decrease beyond 65 nm. Active area characteristics are a precision-engineered part of the any device for optimum performance, and therefore, material loss due to FEOL processing—such as post implant strip, is detrimental to device performance.

In FEOL post implant strip processing, the concern is to remove a hardened photoresist (PR) layer, followed by the remaining bulk PR, without adversely affecting (or removing) any exposed dielectric layer over the underlying active area silicon, which may or may not include N or P dopants and/or Ge. In addition to stringent material loss goals, it is required that the strip process not result in a residue layer that is hard to remove in post implant strip wet cleans. It is desired that any residue after dry strip be water soluble, and or easily removable by conventional techniques such as SPM and/or APM.

Material loss during dry strip occurs due to charged chemical species from the plasma penetrating through the thin dielectric layer into the active area, and reacting with the Si, Ge, or dopants. An example for such a reaction is oxidizing radicals that are driven through the thin dielectric layer by sufficient energy to react and oxidize active area constituents. Results of such an action lead to active area Si or Ge loss. Reducing species (i.e. Hydrogen) can also be disruptive to active area region. The effects of active area damage in dry strip can be realized further by excessive material loss during post strip chemical cleans. It is postulated that penetrating ions from the plasma during dry strip are disruptive enough to the active area surface, bulk, lattice or periodicity causing this area to become ostensibly more susceptible to wet chemical attacks, thus resulting in excessive material loss. To summarize, the extent of active area material loss is not just realized during dry strip, but also during subsequent wet cleans, if the effects of ion energies are not properly controlled or reduced.

In one embodiment, post implant strip is carried out in a plasma reactor modified to reduce the plasma potential (or ion energy). Such changes include, but are not limited to: 1) use of pulsed power plasma generator for plasma source, 2) use of high powered inductive plasma source and/or high chamber pressure, 3) optimize reactor geometry to reduce ion energies at the wafer level and/or 4) use of high impedance path to ground bottom electrode to support the substrate. The forgoing can be used with or without 5) process window changes targeting lower ion-energy regions and/or 6) forming a protective film over the active area prior to, or during any sequence of steps for crust or PR removal.

Crust and bulk PR strip process window changes involve development and characterization of a strip process where ion energies are lowered significantly to a few volts, to be much less disruptive to active area integrity. These process changes involve the use of higher plasma powers (1200-10,000 W) and higher range of strip pressures (10-500 mT) in various sequences for crust and bulk removal to achieve the desired results. These process changes can be coupled with the use of process gas constituents to produce a protective layer to the active area to preserve it significantly during crust and bulk PR removal. The protective layer constituents can include Si, Ge, C, O, H, B, P, As, Sb, F, N and compounds thereof. Process gas constituents used to form this protective layer preferably produce the most effective results in preserving the active area region. These can be non-silane silicon containing gases such as $SiF_4$, germanium containing gases such as $GeF_4$ and $GeH_4$, nitrogen containing gases such as $N_2O$ and $NH_3$, carbon containing gases such as $CF_4$ and CO, boron containing gases such as $B_2H_6$, phosphorous containing gases such as $PH_3$, arsenic containing gases such as $AsH_3$, etc. to limit or eliminate disruption to active area during dry plasma strip. While not wishing to be bound by theory, it is believed that the protective layer lowers active area material loss in a bi-functional way; one by being physically protective over the active area, and the other by being sacrificial or reactive with the plasma. The physically protective aspects of the protective layer from charged species during dry plasma strip provides a shield or buffer to the active area from ions. The sacrificial or reactive nature of the protective layer involves providing constituents similar to the ones in the active area, so that any plasma-wafer interactions, especially involving chemical reactions such as oxidation or reduction, would now occur in the protective layer, instead of the active area. Therefore this chemically protective layer would now endure any chemical disruption due to wafer-plasma interactions rather than the active area region.

As explained above, the "engineered" protective layer over active area region provides a dual function; a chemical protection where it reacts with the plasma preventing active area disruption, as well as a physical protection where it acts as a shield from penetrating ions. The protective layer can be formed under process and apparatus conditions with substantially lower ion energies, but not necessarily limited to those conditions. To illustrate an example of a protective layer, consider a p-type active area (i.e. B or BF2 implanted); where the active area Si is strained with Ge for improved device performance, thus having a SiGe B doped active area. It is envisioned that with $SiF_4+GeF_4+B_2H_6$ (in addition to $O_2$ or $N_2O$ & $C_xH_yF_z$), a thin protective area can be formed to physically shield the active area, and prevent any chemical losses of Si, Ge, or B from the active area.

As explained below, reduction in active area consumption can be achieved through the use of higher plasma power and higher pressure, reduction of active area Si consumption can be achieved through the use of process gas constituents which form a protective layer prior to crust removal and inert carrier gases can be used to lower ion energies.

Figure 2:
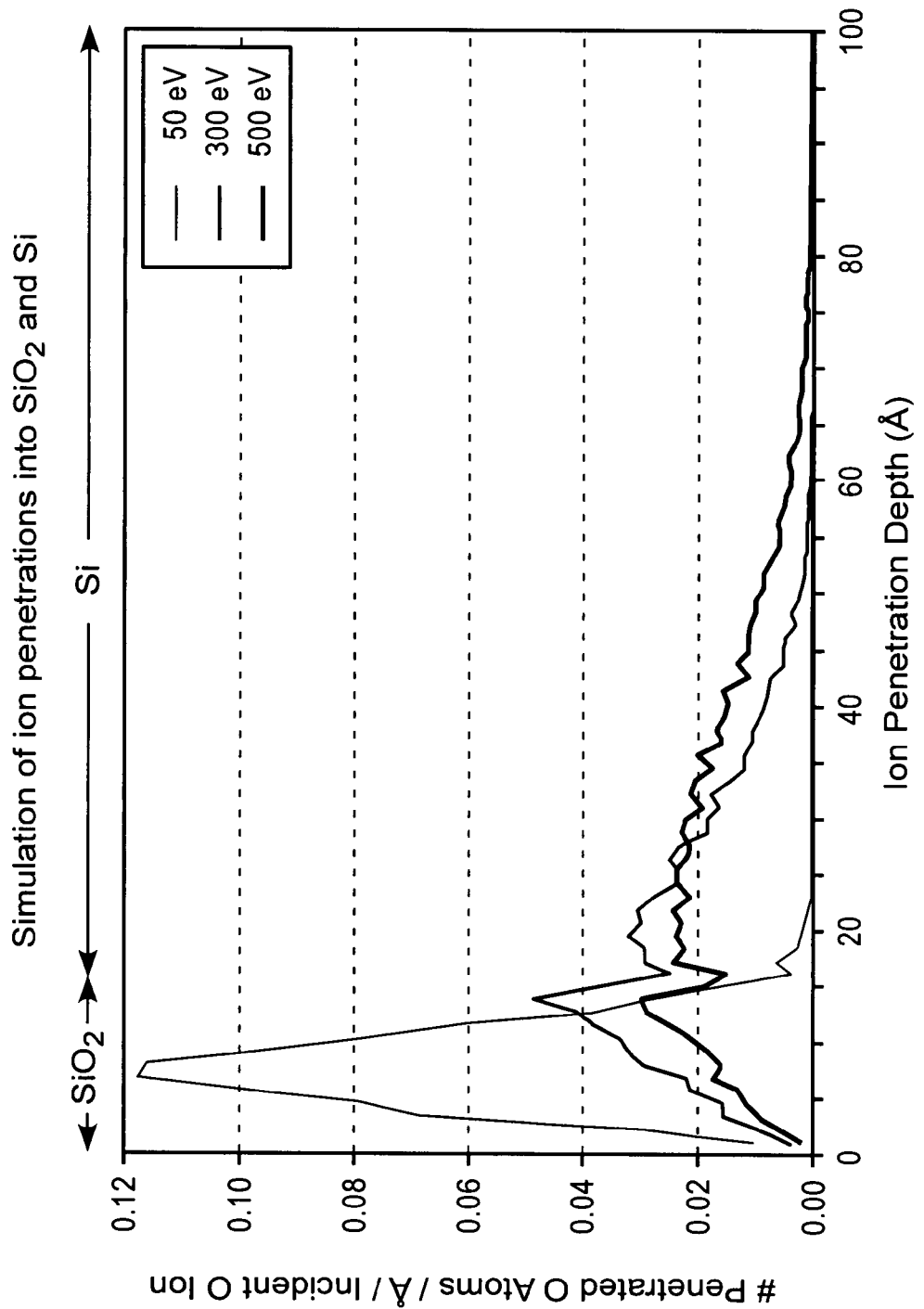
FIG. 2 is a graphical simulation of ion penetrations into silicon oxide (SiOx) and silicon (Si).
Figure 3:
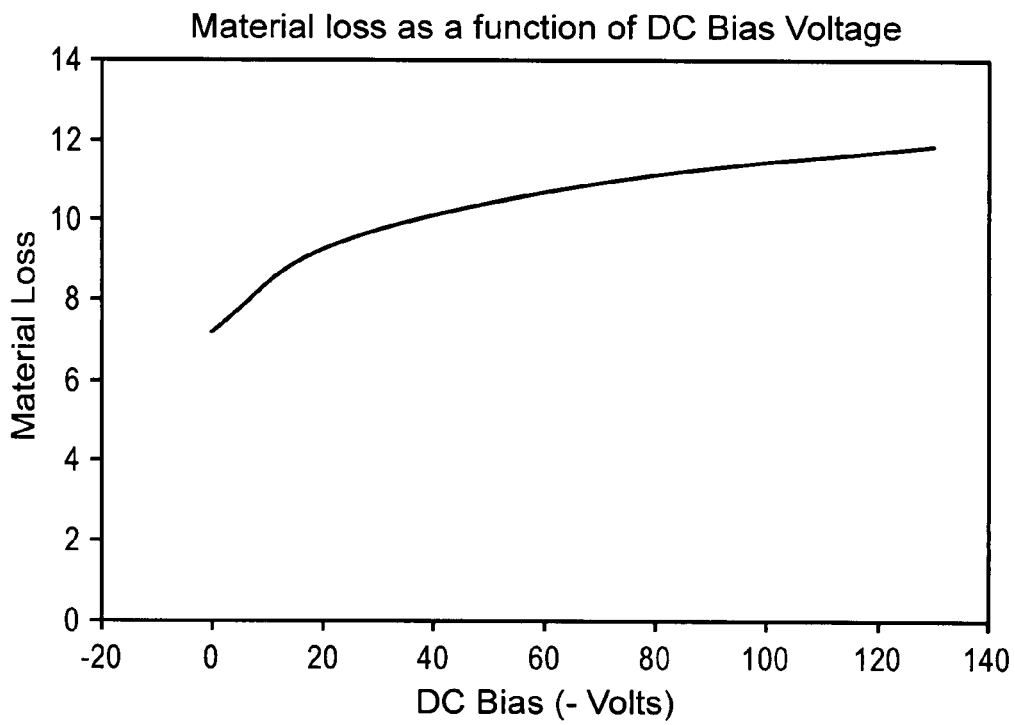
FIG. 3 is a graphical representation of material loss as a function of direct current (DC) bias voltage at a bottom electrode used to support a semiconductor wafer.

With reference to FIGS. 2 and 3, active area material loss is correlated with penetration of ions into the substrate. More specifically, FIG. 2 shows simulation results of ion penetrations into $SiO_2$ and Si for various ion energies, typical in FEOL plasma processing, as a demonstration of the disruption to active area region caused by penetrating ions. FIG. 3 shows the relation of DC bias on material loss. As the ion energy increases, material loss increases, either due to dry processing alone, or post subsequent wet clean, due to the enhanced reactivity of the wet clean chemistry with the disrupted active area region. Even at zero bias there is significant material loss. In this case, most of the loss is due to ion energy imparted by the plasma potential. Ion energy can be reduced by reducing the plasma potential.

Figure 4:
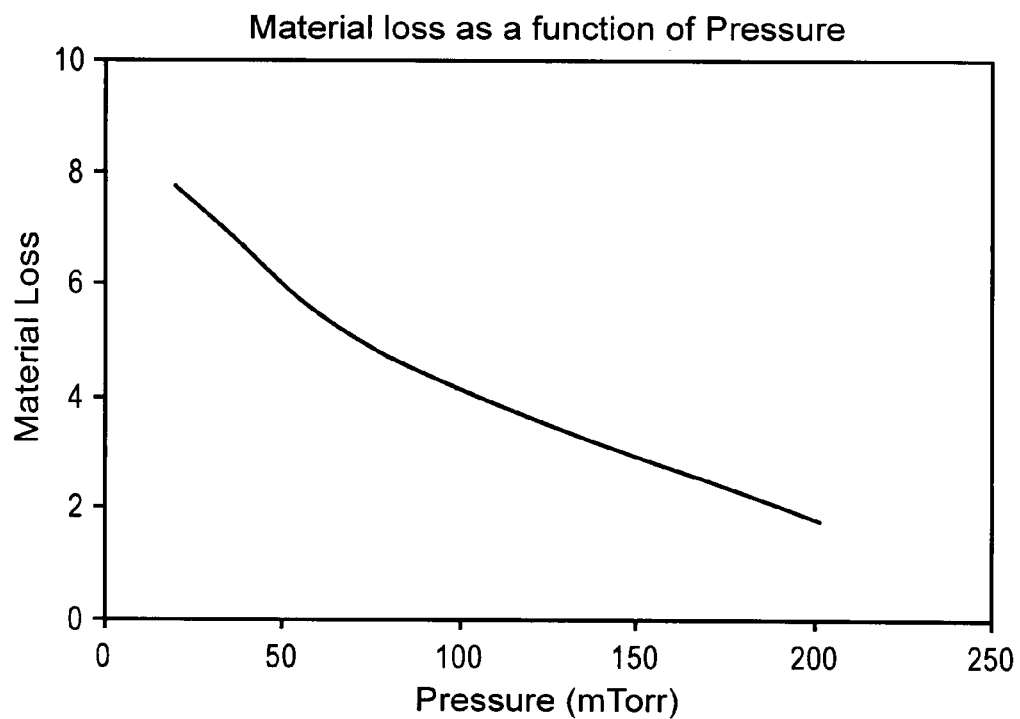
FIG. 4 is a graphical representation of material loss as a function of chamber pressure.
Figure 5:
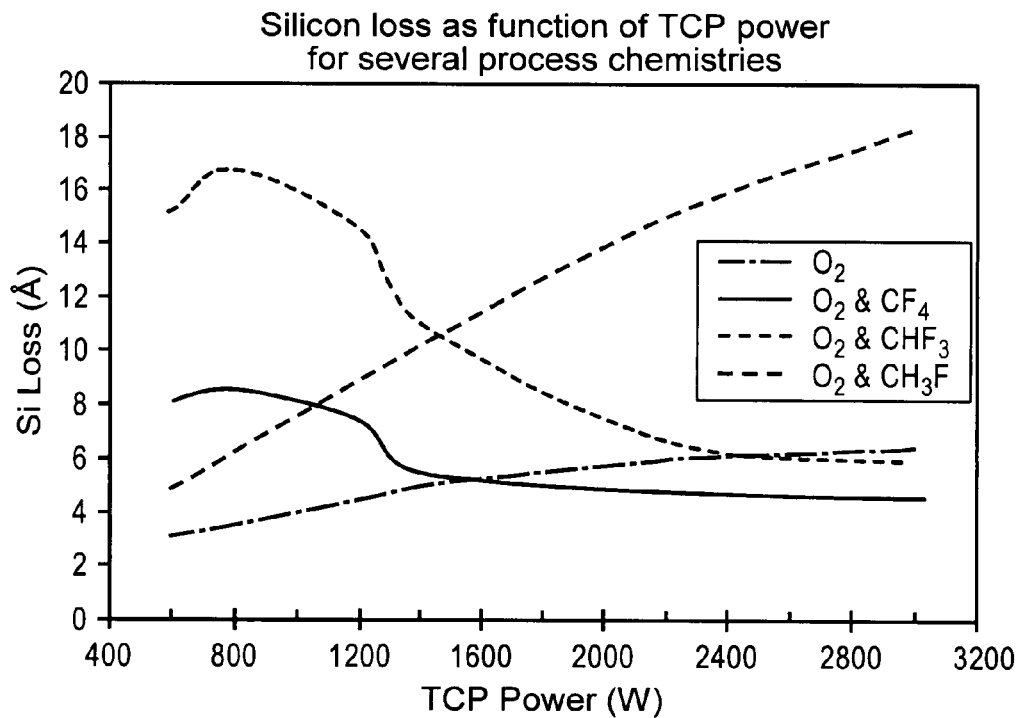
FIG. 5 is a graphical representation of silicon loss as a function of TCP power for four process gas chemistries.

With reference to FIGS. 4 and 5, effects of chamber pressure and TCP power are discussed. In a TCP reactor, an increase in pressure can be used to reduce plasma potential and collisional slowing of ions, therefore lowering ion energy. FIG. 4 shows material loss as function of pressure. In addition, fluorocarbon and/or hydrofluorocarbon addition to the process gas can provide protection of the substrate. Preferably, one or more fluorocarbons or hydrofluorocarbons are added to oxygen (or other oxidants) to achieve a significant impact on material loss. FIG. 5 demonstrates the effect of TCP power on silicon loss for several processes. The data were obtained using a TCP reactor without a Faraday shield: The addition of $CF_4$ and $CHF_3$ coupled with increased TCP leads to reduction of silicon loss. However, a pure $O_2$ process, or addition of $CH_3F$, does not lead to reduction of silicon loss at high TCP power. The increased TCP power leads to an increased plasma potential and $CF_4$ and $CHF_3$ additives are dissociated more at higher TCP power to provide increased number of polymerizable species, such as CF and $CF_2$. However, $CH_3F$ cannot dissociate to form protective poly-fluorocarbons and hence leads to an increase in silicon loss. Not only does $CH_3F$ not form poly-fluorocarbons, but at high TCP power $CH_3F$ forms an excess of fluorine, thereby furthering the loss of silicon. The presence of fluorine and fluorocarbons in a plasma can lead to direct oxide loss by etching. However, higher TCP power does reduce the etch rate of silicon dioxide. The lower oxide etch rate for $O_2+CH_3F$ suggests that other fluorocarbon or hydrofluorocarbon additives to oxygen may be able to achieve lower $SiO_2$ etch rates while keeping silicon loss low.

Figure 6:
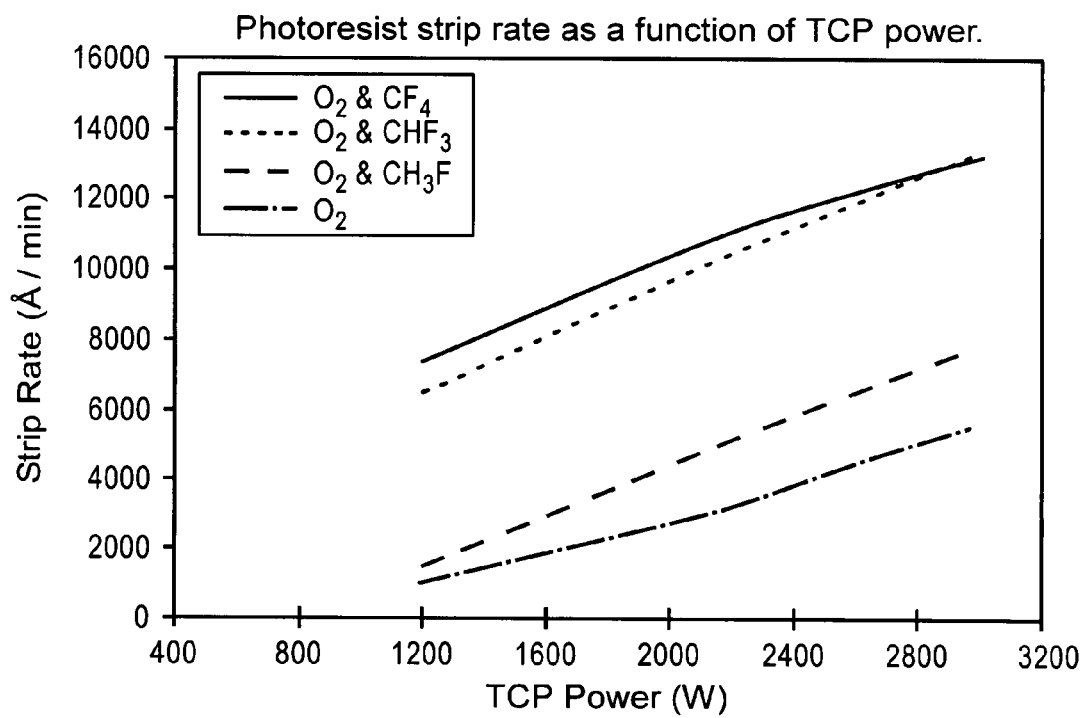
FIG. 6 is a graphical representation of photoresist strip rate as a function of TCP power for four process gas chemistries.

With reference to FIG. 6, it can be seen that the photoresist strip rate increases with increase in TCP power for four process gas chemistries ($O_2+CF_4$, $O_2+CHF_3$, $O_2+CH_3F$, $O_2$). A higher TCP power provides the advantage of a higher photoresist strip rate. This is an advantage since at a higher strip rate the exposure time of the substrate to the plasma will be shorter. A shorter time will mean lower material losses.

Figure 7:
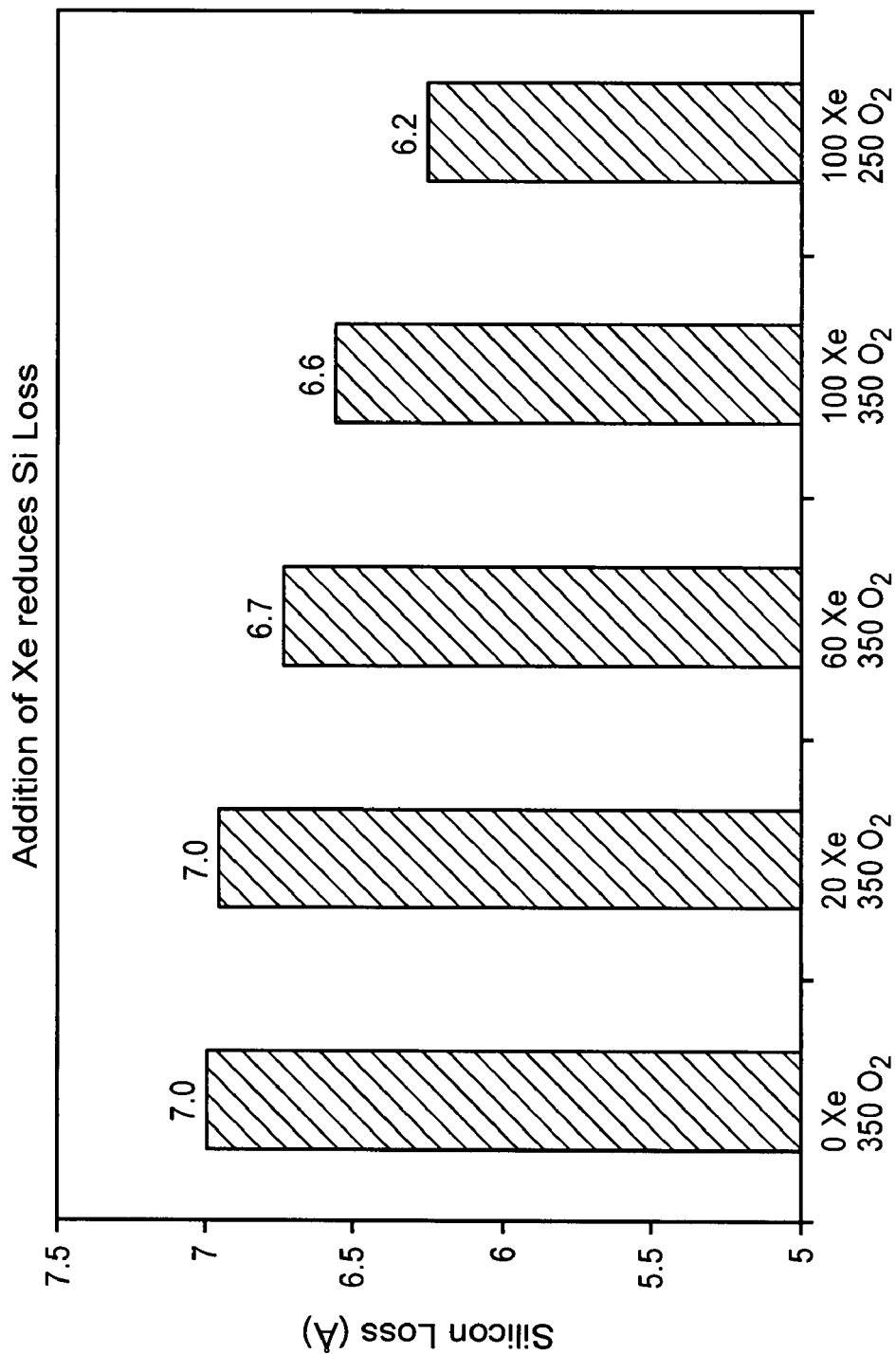
FIG. 7 is a graphical representation of silicon loss for five gas chemistries with 0 to 100 sccm Xe and 350 sccm $O_2$.

The addition of heavy inert gases such Kr or Xe can have a two fold effect. First, the heavy inert gases can lower the plasma potential since their ionization potential is lower than $O_2$. The potential is lowered since it requires less energy to ionize these high atomic number gases. This "cools" the plasma electrons leading to a lower plasma potential. Second, the presence of heavy inert gases can provide additional bombardment energy to the crust leading to its faster removal. The heavy atoms can also help remove residues. FIG. 7 shows the effect of addition of Xe to an $O_2$ TCP plasma on silicon loss in a TCP reactor without a Faraday shield.

Figure 8:
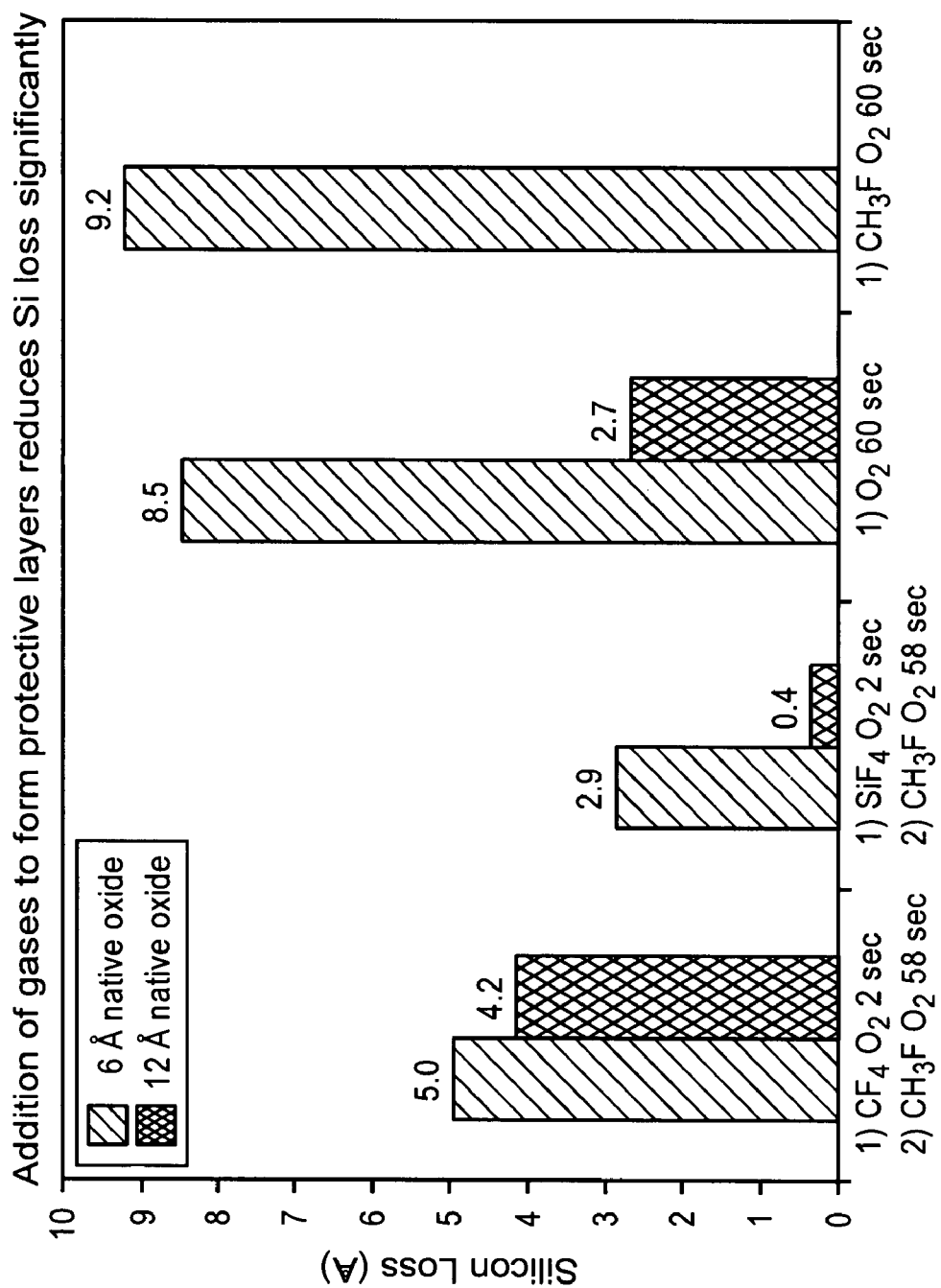
FIG. 8 is a graphical representation of silicon loss for four gas chemistries wherein the side-by-side bars represent 6 Å and 12 Å native oxide, respectively.

FIG. 8 combines process regimes at lower plasma potential (lower ion energy—using high TCP power and high pressure), and formations of a protective layer over the active area. The results are outstanding with respect to Si loss. In essence, with roughly 12A of native oxide over the active area, and a protective layer using $SiF_4$, silicon loss can effectively be eliminated.

Figure 9:
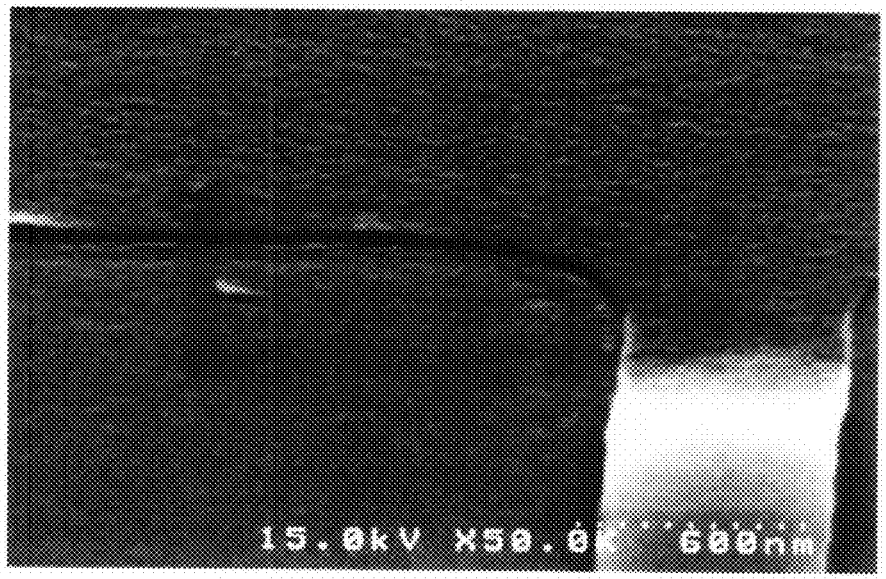
FIG. 9 is a scanning electron micrograph (SEM) of an undesired residue resulting from use of process gas of 30 sccm $CHF_3$ and 350 sccm $O_2$ for 100 seconds followed by deionized water (DI) rinse.
Figure 10:
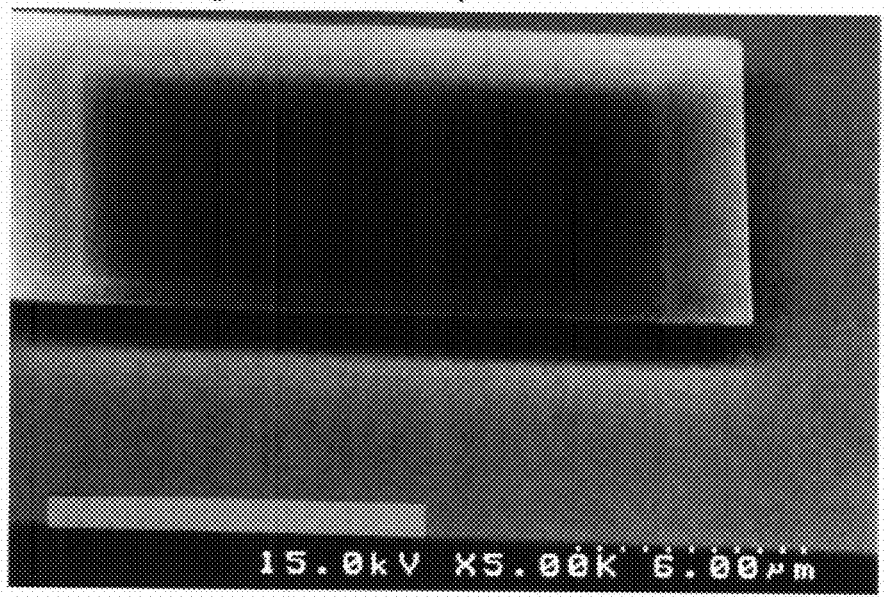
FIG. 10 is a scanning electron micrograph (SEM) of an undesired residue on a substrate resulting from use of process gas of 30 sccm $CF_4$ and 350 sccm $O_2$ for 100 seconds followed by deionized water (DI) rinse.
Figure 11:
FIG. 11 is a scanning electron micrograph (SEM) of a residue-free substrate resulting from use of process gas of 30 sccm $CF_4$ and 350 sccm $O_2$ for 10 seconds followed, process gas of 10 sccm $CH_3F$ and 350 sccm $O_2$ for 100 seconds by deionized water (DI) rinse.
Figure 12:
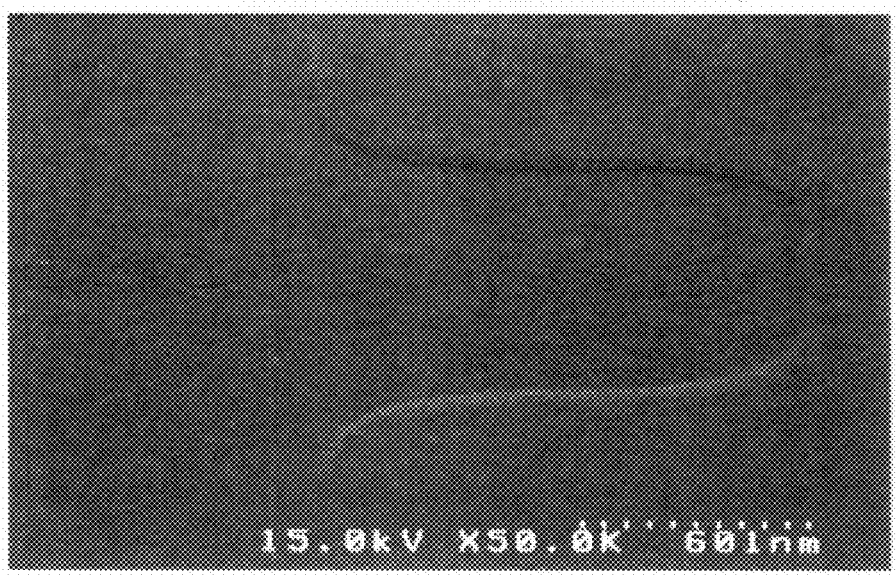
FIG. 12 is a scanning electron micrograph (SEM) of residue-free resulting from use of process gas of 10 sccm $SiF_4$ and 350 sccm $O_2$ for 2 seconds followed, process gas of 10 sccm $CH_3F$ and 350 sccm $O_2$ for 90 seconds by deionized water (DI) rinse.
Figures 13A, 13C:
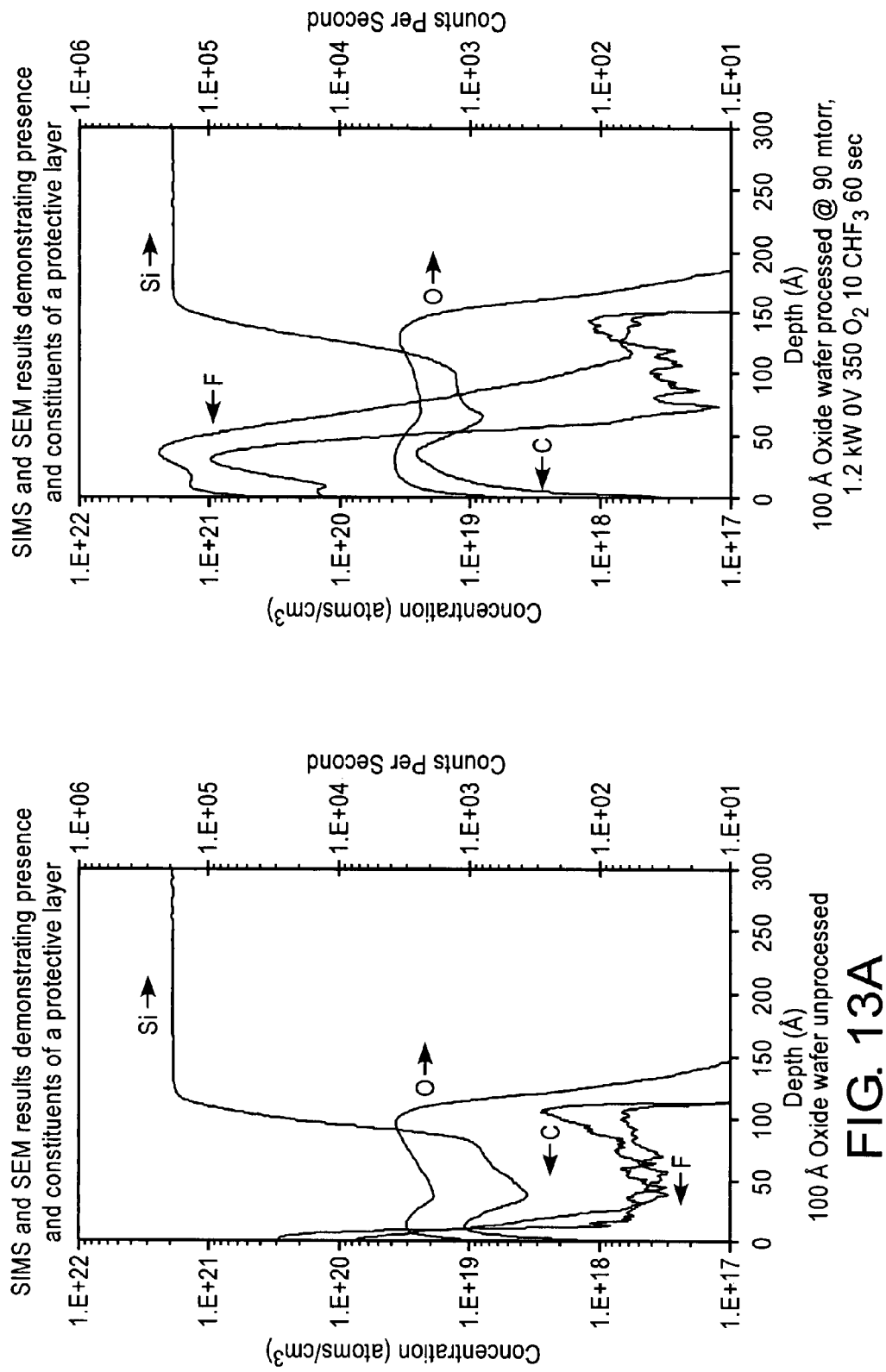
FIGS. 13A and B show SIM and SEM results for a 100 Å oxide wafer which has not been processed.
FIGS. 13C and D show SIM and SEM results for a 100 Å oxide wafer processed at a chamber pressure of 90 mTorr, 1.2 kW TCP power, 0 volts bias on the bottom electrode, 350 sccm $O_2$ and 10 sccm $CHF_3$ for 60 seconds.
Figure 13B:
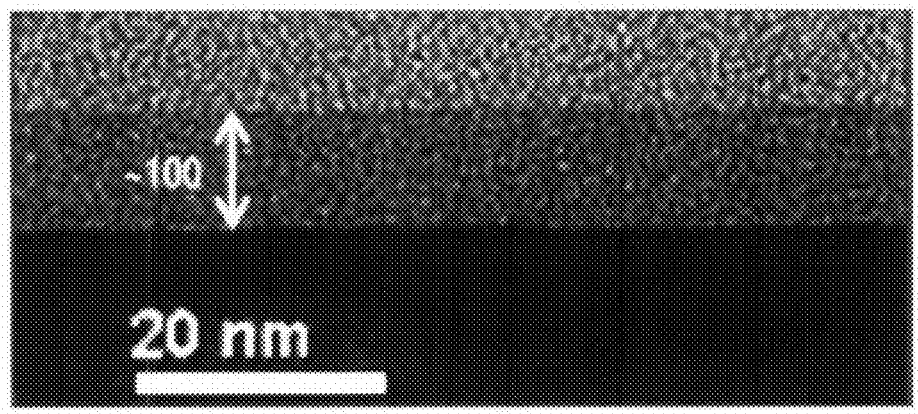
Figure 13D:
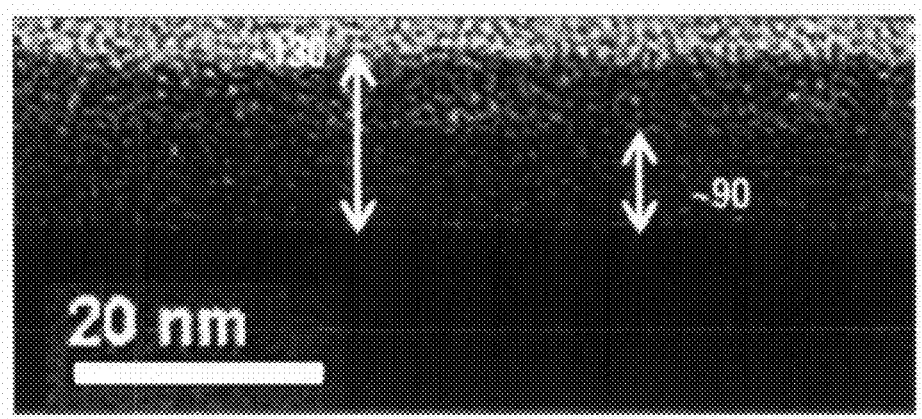

FIGS. 9 and 10 are illustrations of bad residue results where it can be seen crust is not clearly removed. FIGS. 11 and 12 are examples of early development of protective layer and residue results. FIG. 11 shows the evidence of a protective layer with SEM as well as the SIMS makeup of a protective layer. FIG. 13 demonstrates residue free performance using lower ion energy process window with a protective layer.

Figure 14:
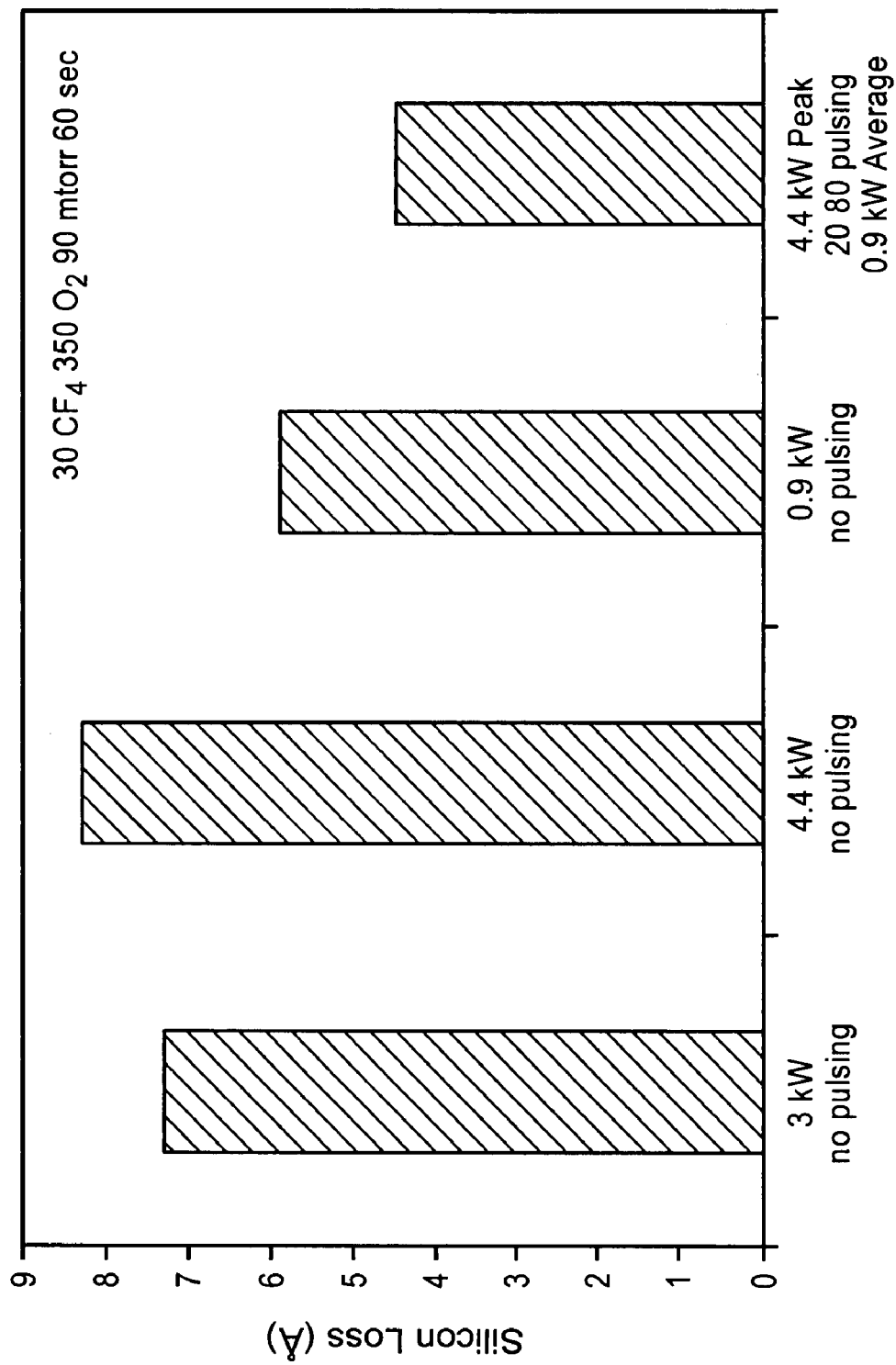
FIG. 14 illustrates the effects of using a pulsed plasma on silicon loss.

FIG. 14 shows the effect of using a pulsed plasma on silicon loss with a process gas of $SiF_4+Ar$ compared to $O_2+CH_3F$. Active area protection was carried out for 4 seconds while the TCP reactor was run at 3 or 4.4 kW ulsed TCP power, 0 volt bias, 20° C. substrate support temperature, 5 sccm $SiF_4+250$ sccm Ar, 90 mTorr chamber pressure followed by a photoresist strip for 60 seconds while in a second test the TCP reactor was run at 3 kW TCP power without pulsing, 0 volt bias, 20° C. substrate support temperature, 10 sccm $CH_3F+350$ sccm $O_2$, 90 mTorr chamber pressure.

Figure 15:
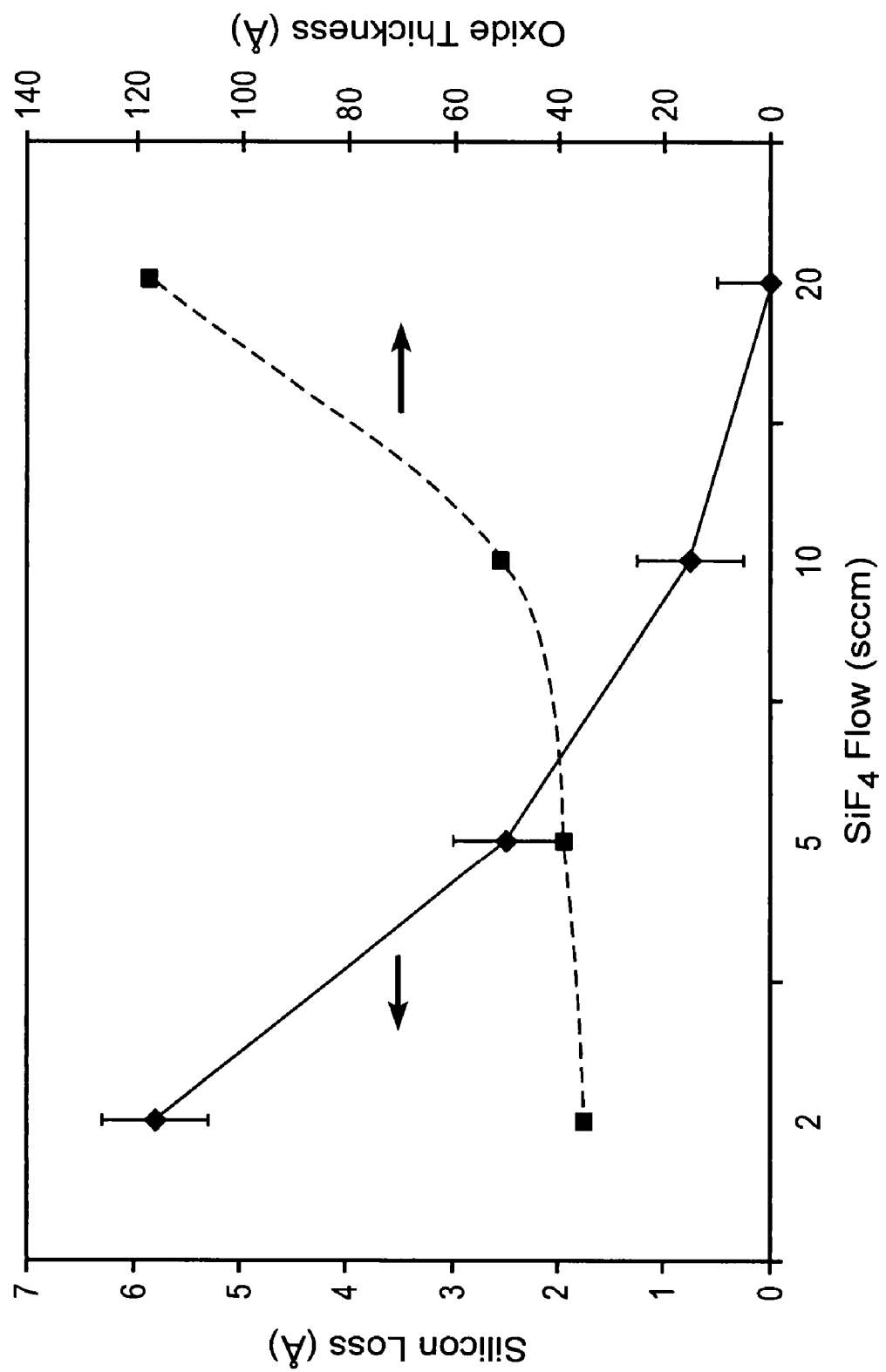
FIG. 15 illustrates influence of $SiF_4$ flow rate on silicon loss and oxide thickness.

The influence of $SiF_4$ flow rate on silicon loss and oxide thickness are shown in FIG. 15. As the $SiF_4$ flow rate increases from 2 to 20 sccm, the oxide thickness increases from about 40 Å to about 120 Å wherein the silicon loss decreases from about 6 Å to 0 Å. To minimize increase in oxide thickness and silicon loss, a $SiF_4$ flow rate of about 5 to 10 sccm is preferred.

Figure 16:
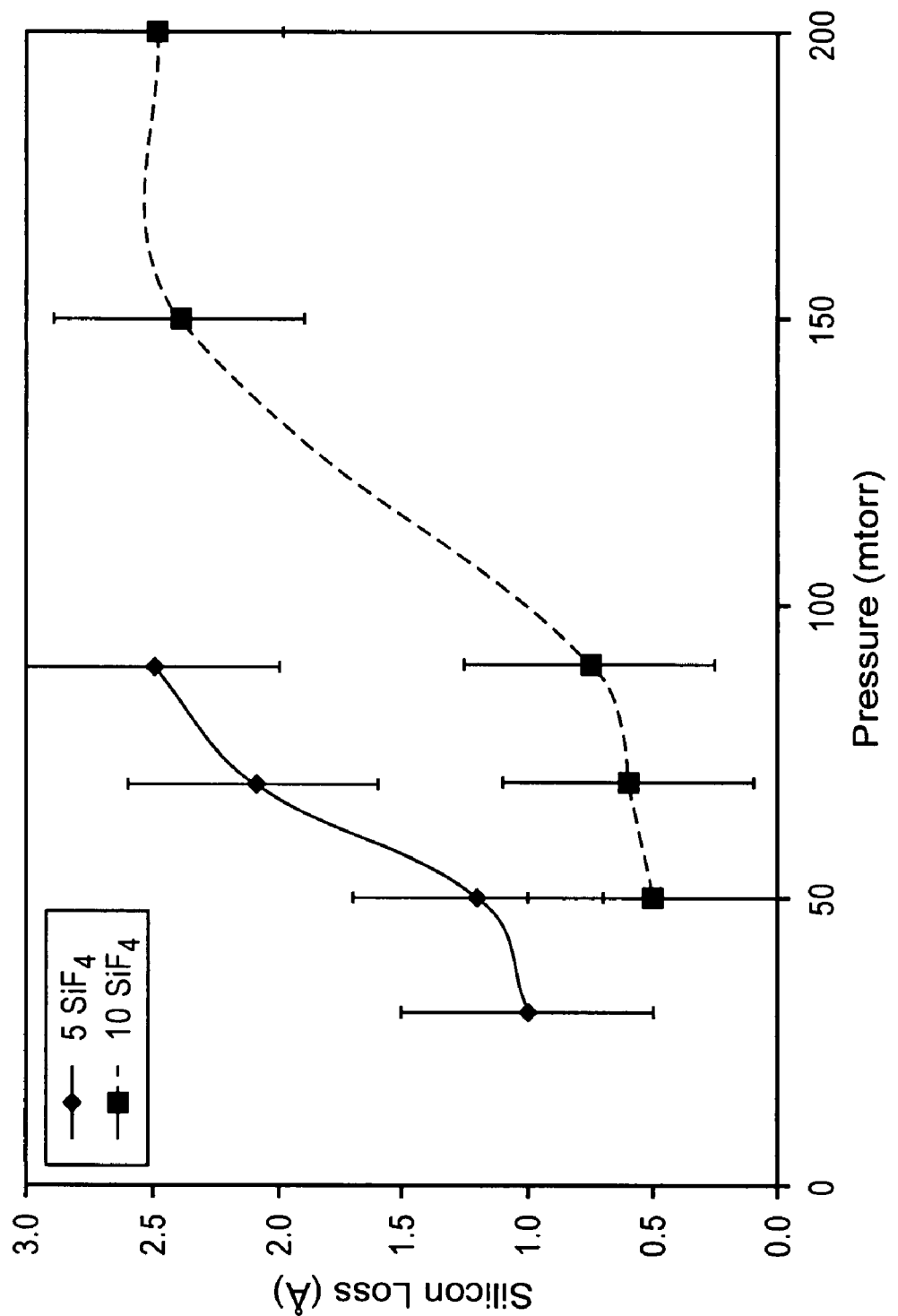
FIG. 16 illustrates influence of chamber pressure at two $SiF_4$ flow rates and FIG. 17 illustrates influence of spacing between coil and wafer on silicon loss.

The influence of chamber pressure at two $SiF_4$ flow rates is shown in FIG. 16. As the pressure increases from 50 mTorr to 200 mTorr, the silicon loss increases from about 0.5 to about 2.5 Å for a 10 sccm $SiF_4$ flow rate and from about 1 Å to about 2.5 Å for a 5 sccm $SiF_4$ flow rate. To minimize silicon loss, a $SiF_4$ flow rate of about 10 sccm at a chamber pressure of 50 to 100 mTorr is preferred.

Figure 17:
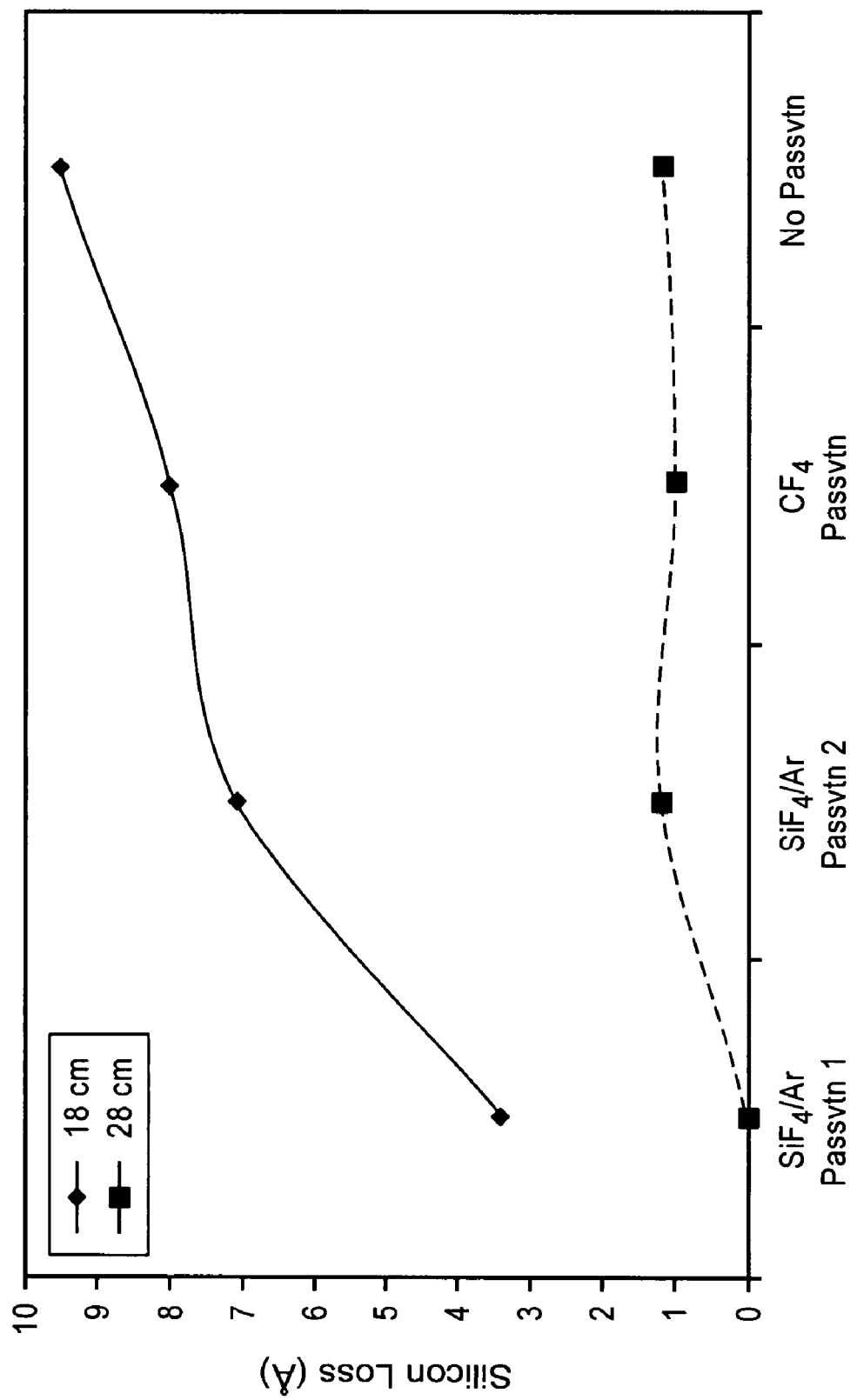

The influence of spacing between the coil and the substrate is shown in FIG. 17. During removal of the photoresist, penetration of oxygen and fluorine into the active area causes silicon loss by forming a layer of SiOF in a region of the silicon adjacent the active area. As a result, the 6 Å native oxide in effect becomes thicker and the silicon in the active area is lost due to conversion to the SiOF layer. The results shown in FIG. 17 show that silicon loss can be substantially improved when the coil to water spacing is changed from 18 to 28 cm.

It has been determined that silicon loss can be minimized without using a Faraday shield. Increasing of TCP power increases plasma density which leads to lower electron temperature. Lower electron temperature provides lower plasma potential seen by the wafer and thus lower ion energy. Thus, reducing plasma potential can provide less penetration of ions into the active area of the wafer. Faraday shields are used with inductively coupled plasma chambers to remove capacitive coupling from the induction coil. Such capacitive coupling from the coil can raise the relative plasma potential. However, capacitive coupling can also be minimized by plasma geometry modifications. Such modifications include thickness of the dielectric window beneath the coil, distance between the coil and the chamber walls, and distance between the substrate and the coil. It has been determined that by adjusting chamber geometry to reduce plasma potential, it is not necessary to include a Faraday shield to remove capacitively coupling from the inductive coil. For example, the window can be made at least 4 cm thick, the outer periphery of the coil can be spaced at least 5 cm from the inner wall of the chamber and/or the substrate can be located at least 10 cm, preferably at least 20 to 35 cm from the coil.

It will be apparent to those skilled in the art that various changes and modifications can be made, and equivalents employed, to the foregoing detailed description with reference to specific embodiments thereof, without departing from the scope of the appended claims.

What is claimed is:

1. A method of protecting an active area on a substrate, comprising:

positioning a substrate in an inductively coupled plasma processing chamber of a plasma reactor, the plasma reactor including a dielectric window overlying the substrate and at least one coil which inductively couples RF energy through the dielectric window and into a space between the dielectric window and the substrate, the substrate including an active area;

supplying a process gas to the plasma processing chamber, generating a plasma from the process gas by supplying power to the coil;

processing the substrate with the plasma so as to protect the active area by (a) maintaining a plasma potential of about 5 to 15 volts at the substrate during the processing and/or (b) passivating the active area by using a silane-free process gas comprising at least one additive effective to form a protective layer on an active area of the substrate wherein the protective layer includes at least one element from the additive which is already present in the active area.

2. The method of claim 1, wherein the additive element comprises Si, Ge, As, Sb, In, P and/or B and compounds thereof including $BF_2$.

3. The method of claim 1, wherein the passivating is carried out while pulsing supply of power to the coil with power on for 2 to 20 μsec and power off for 30 to 100 μsec.

4. The method of claim 1, wherein the passivating is carried out while supplying 400 to 10,000 watts of power to the coil.

5. The method of claim 1, wherein the passivating is carried out without RF bias applied to the substrate.

6. The method of claim 1, wherein the method is carried out while maintaining the chamber at a pressure of 10 to 500 mTorr.

7. The method of claim 1, wherein in the passivating the process gas includes at least one of $SiF_4$, $O_2$, Ar, Ne, Kr, Xe, $C_xF_y$ where $x \geq 1$ and $y \geq 2$, $C_xF_yH_z$ where $x \geq 1$, $y \geq 2$ and $z \geq 1$.

8. The method of claim 1, further comprising stripping photoresist from the substrate.

9. The method of claim 1, wherein the coil is a planar coil and the substrate is spaced 10 to 30 cm from the coil during the processing.

10. The method of claim 1, wherein the process gas includes 100 to 800 sccm total of $O_2$, Ar, Ne, Kr and Xe during the processing.

11. The method of claim 1, wherein the dielectric window is at least 4 cm thick, the coil has an outer periphery spaced inward of the inner wall of the chamber by at least 5 cm, the substrate is spaced at least 10 cm from the coil, and the chamber does not include a Faraday shield.

12. The method of claim 1, further comprising stripping an ion-implanted photoresist from the substrate.

13. The method of claim 1, wherein a silicon-oxide layer overlies the active area and the additive is present in an amount effective to passivate the silicon-containing layer.

14. The method of claim 1, wherein the processing is carried out by passivating the active layer for less than 10 seconds.

15. The method of claim 1, further comprising stripping photoresist on the substrate with an oxygen plasma in the chamber, wherein the substrate includes silicon in the active region and no more than 2 Å of the silicon is lost by conversion during the stripping.

16. The method of claim 1, wherein the substrate is supported on a substrate support maintained at a temperature of −20 to 75° C. and pressure in the chamber is less than 500 mTorr during the processing.

17. The method of claim 1, further comprising, after the processing, cleaning the substrate with deionized water or other wet clean chemistry.

18. The method of claim 1, wherein the plasma chamber does not include a Faraday shield.

19. The method of claim 13, wherein the silicon oxide layer is a native oxide, a thermally grown oxide, or is formed by CVD or ion immersion.

20. The method of claim 13, wherein the silicon oxide layer has a thickness of 20 to 40 Å or less than or equal to 20 Å.

* * * * *